United States Patent [19]

Jun

[11] Patent Number: 5,714,780
[45] Date of Patent: Feb. 3, 1998

[54] SEMICONDUCTOR MEMORY AND METHOD OF FABRICATING THE SAME

[75] Inventor: Young Kwon Jun, Seoul, Rep. of Korea

[73] Assignee: LG Semicon Co., Ltd., Seoul, Rep. of Korea

[21] Appl. No.: 826,043

[22] Filed: Mar. 28, 1997

Related U.S. Application Data

[60] Continuation of Ser. No. 471,142, Jun. 6, 1995, abandoned, which is a division of Ser. No. 174,228, Dec. 28, 1995, Pat. No. 5,449,635.

[51] Int. Cl.$^6$ ............................................. H01L 27/108
[52] U.S. Cl. .......................... 257/308; 257/306; 257/307; 257/309
[58] Field of Search ............................... 257/306, 309, 257/307, 308, 296

[56] References Cited

U.S. PATENT DOCUMENTS

| | | | |
|---|---|---|---|
| 4,489,481 | 12/1984 | Jones | 257/760 |
| 5,049,957 | 9/1991 | Inoue et al. | 257/296 |
| 5,068,698 | 11/1991 | Koyama | 257/306 |
| 5,071,781 | 12/1991 | Seo et al. | 437/47 |
| 5,102,820 | 4/1992 | Chiba | 437/52 |
| 5,164,337 | 11/1992 | Ogawa et al. | 437/228 |
| 5,219,780 | 6/1993 | Jun | 437/52 |
| 5,305,256 | 4/1994 | Tanigawa | 257/306 |
| 5,314,835 | 5/1994 | Iguchi et al. | 437/52 |
| 5,323,037 | 6/1994 | Su | 257/308 |

Primary Examiner—Sara W. Crane
Attorney, Agent, or Firm—Morgan, Lewis & Bockius LLP

[57] ABSTRACT

A semiconductor memory includes a semiconductor substrate, a transistor having a gate pole, a source area, and a drain area formed on the semiconductor substrate, an insulation layer formed on a surface of the transistor, the insulation layer having a contact hole with a round upper part, the contact hole exposing the source area of the transistor, and a capacitor storage node having a first conduction layer and a second conduction layer, wherein the first conduction layer is formed inside the contact hole and along the round upper part of the contact hole on the insulation layer and extended up to a preset height, the second conduction layer is formed over the first conduction layer, the second conduction layer having a first part laying on the first conduction layer and a curved second part connected to a first end of the first part, the second part extending above the first part, thus forming a curved internal space between the first part and the second part.

8 Claims, 9 Drawing Sheets

SEMICONDUCTOR MEMORY AND METHOD OF FABRICATING THE SAME

CROSS REFERENCE TO RELATED APPLICATION

This application is a continuation of application Ser. No. 08/471,142, filed Jun. 6, 1995, now abandoned; which is a divisional of application Ser. No. 08/174,228, filed Dec. 28, 1993 now issued as U.S. Pat. No. 5,449,635.

FIELD OF THE INVENTION

This invention relates to a semiconductor memory having a stacked capacitor and a method of fabricating the same.

BACKGROUND OF THE INVENTION

Keeping pace with the development of semiconductors, efforts to integrate more elements onto one semiconductor chip in high degree have been actively progressing. Particularly, in DRAM (Dynamic Random Access Memory) cell, various cell structures have been proposed to minimize the size of the element.

For high integration purpose, it is preferable that a memory cell is composed of one transistor and one capacitor to minimize the occupied area on a chip.

In a memory cell composed of one transistor and one capacitor, a signal charge is stored in a storage node of the capacitor which is connected to the transistor (switching transistor). Consequently, if the size of a memory cell is decreased for high integration purpose, because the size of the capacitor has to be decreased accordingly, the charge which can be stored in a storage node also has to decrease.

On the other hand, in order to transmit a desired signal without any malfunction, the capacitor storage node of a memory cell has to have a surface area large enough to secure a capacitor capacity required for the transmission of the signal.

Thus, in order to decrease the size of a memory cell and assure the proper operation of the memory cell at the same time, a capacitor storage node has to have a relatively large area within the limited area of a semiconductor substrate.

Of the various memory cell constructions proposed to increase the surface area of a capacitor storage node, a stack capacitor is a capacitor structure having the advantages for both high integration and reliable performance.

Further, a memory cell having stacked capacitor also has the advantages of being suitable for mass production with a relatively simple process.

Referring to FIGS. 1(a) to 1(g), a stacked capacitor disclosed by H. Ogawa et al. (U.S. Pat. No. 5,164,337) is explained hereinafter.

Figure 1A:
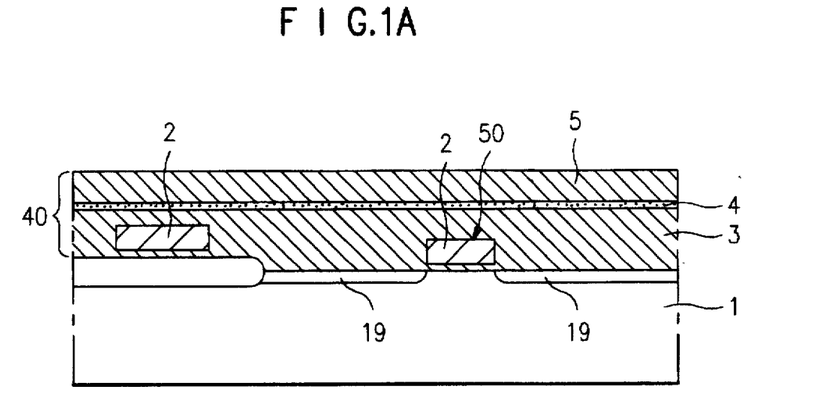
FIGS. 1(a) to 1(g) are conventional processes showing a forming method of a capacitor of a semiconductor memory.

At first, as shown in FIG. 1(a), form a switching transistor 50 having N-impurity regions 19 functioning as a source and a drain, and gate poles 2, on a P-silicon substrate. Then form a multi-layer insulation film of first oxide film 3, nitride film 4 and second oxide film 5 being coated successively on the entire surface of the formed switching transistor 50.

Figure 1B:
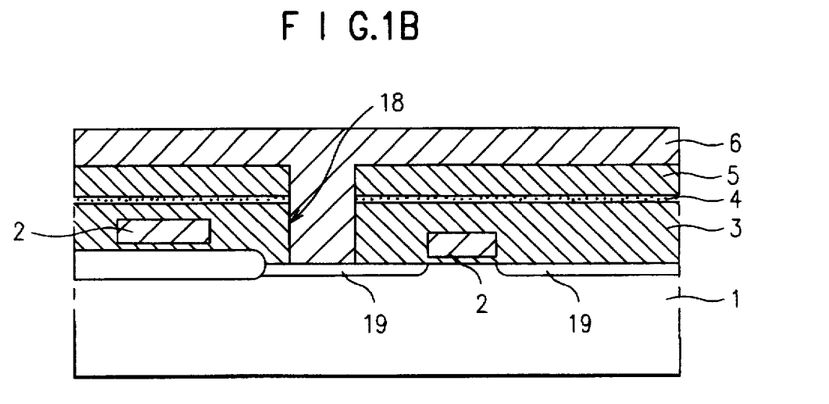

Next, as shown in FIG. 1(b), after forming contact hole 18 with a photo etching process for connecting the switching transistor with the capacitor storage node formed in the successive process, form first conduction layer 6 on the entire surface of the second oxide film 5 including the contact holes 18.

Figure 1C:
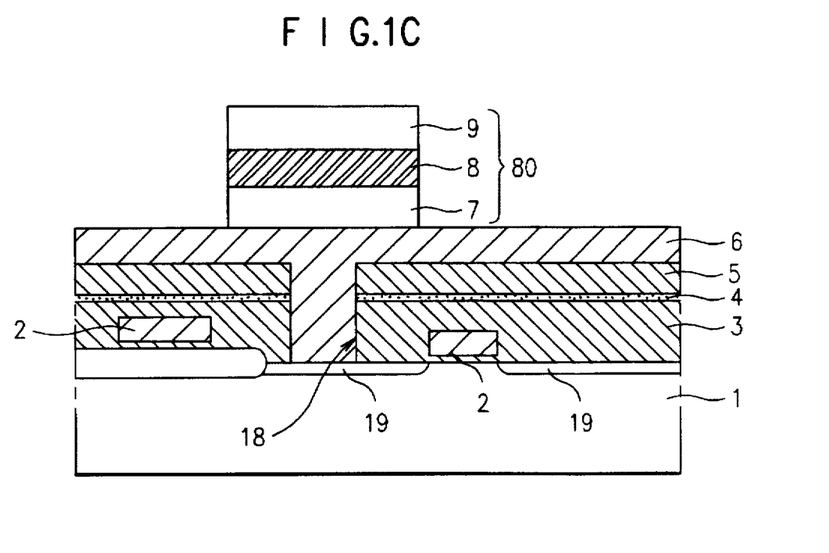

Thereafter, as shown in FIG. 1(c), form a multi-layer film 80 by depositions of more than two layers of insulation film (for example, a first NSG (Nondoped Silicate Glass) film 7, a PSG (Phospho-Silicate Glass) film 8 and a second NSG film 9) having different wet etching property alternatively. Then form a desired pattern by etching the multi-layer film 80 with an anisotropic etching.

Figure 1D:
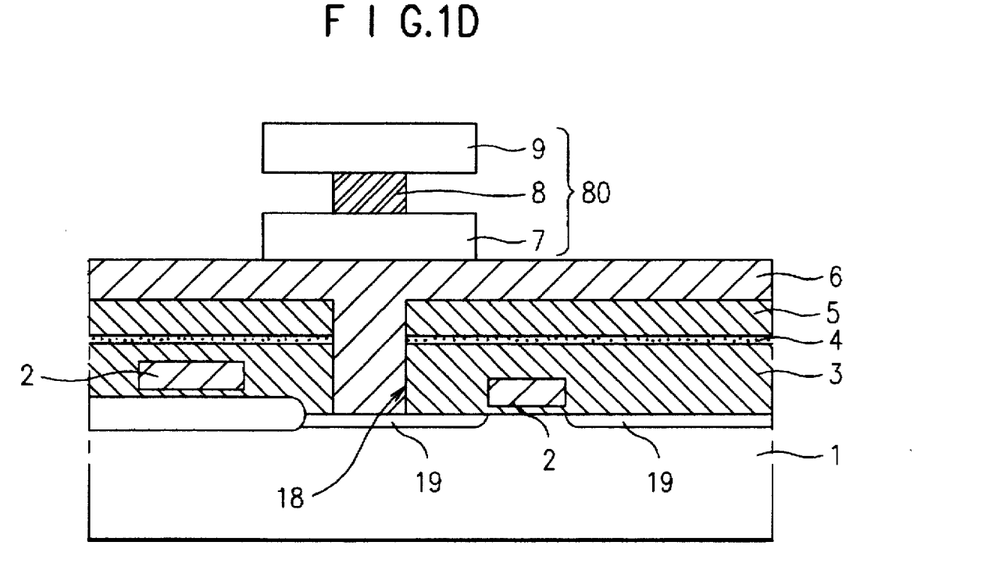

Next, as shown in FIG. 1(d), etch the patterned multi-layer film 80 in NH4:HF=20:1 solution for two minutes with isotropic etching so as to form indented part thereon according to the different degree of etching of the multi-layer film 80.

Figure 1E:
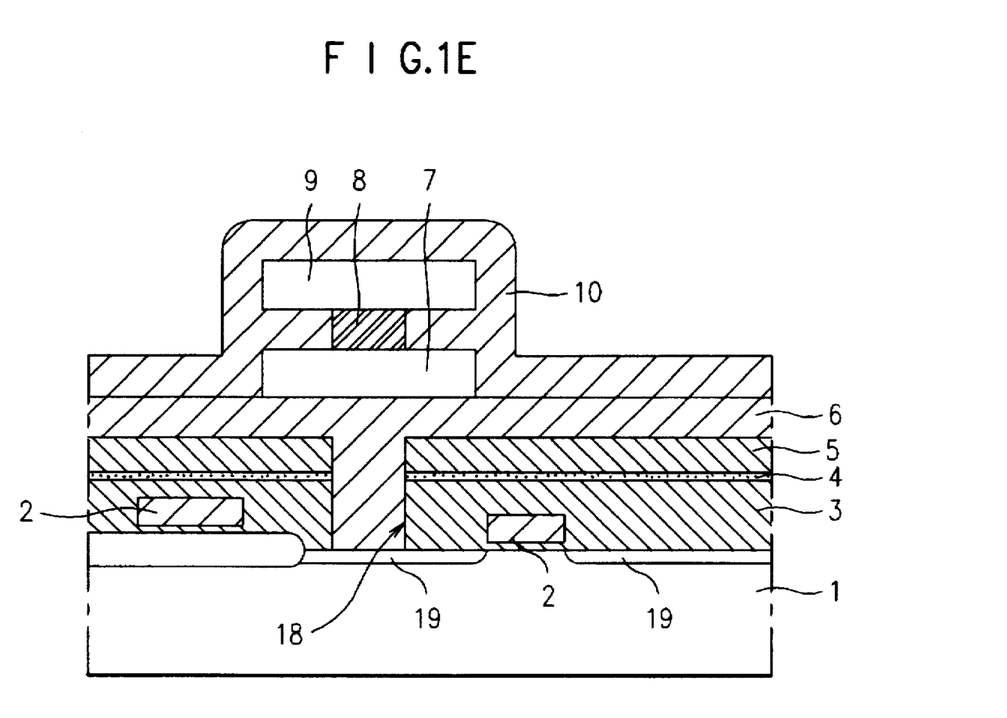
Figure 1F:
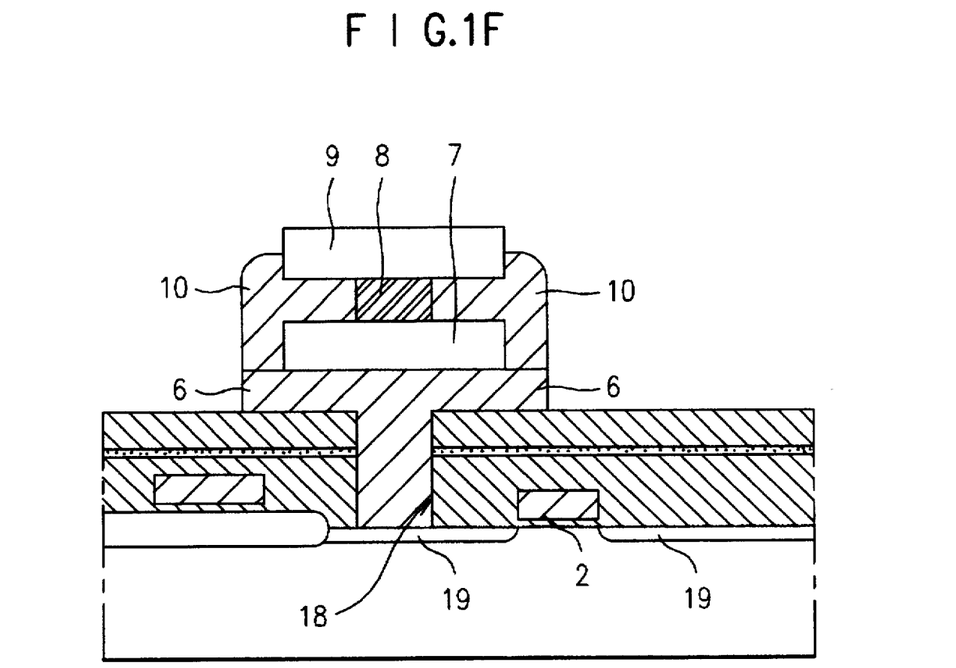

Then, after forming a second conduction layer 10 on all over the surface of above resultant as shown in FIG. 1(e), etch back with anisotropic etching so as to leave the second conduction layer 10 only on the side of the multi-layer film 7, 8 and 9, and leave the first conduction layer 6 exposed thereafter as shown in FIG. 1(f).

And, by removing the multi-layer film 7, 8 and 9, and the second oxide film 5 under the first conduction layer 6 with wet etching, a capacitor storage node 11 composed of first conduction layer 6 and the second conduction layer 10 is completed.

Figure 1G:
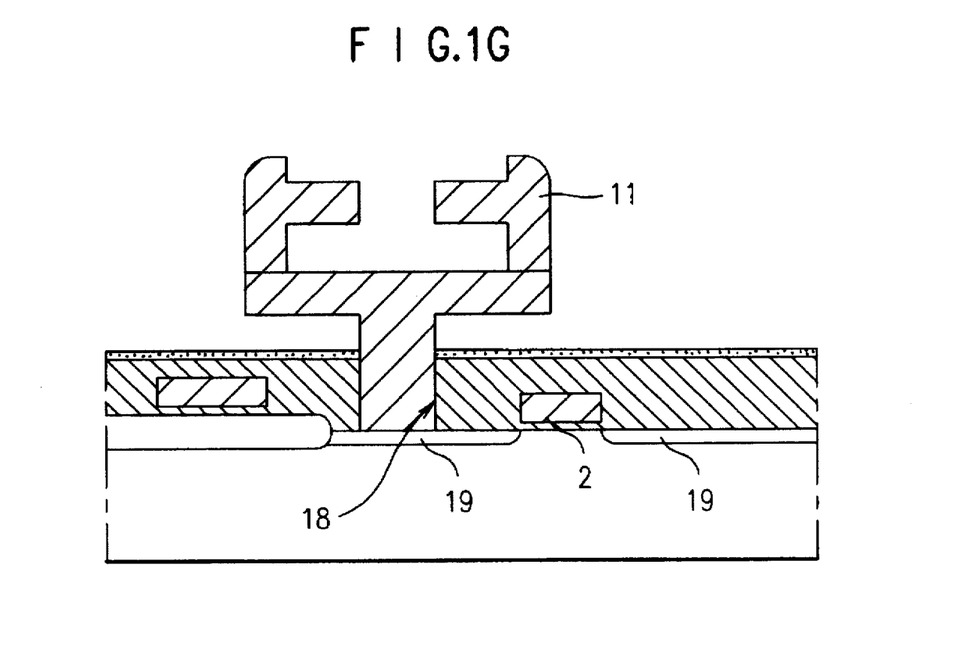

Thereafter, by forming dielectric film and plate pole (not shown) using general capacitor forming process, a box shape semiconductor memory cell capacitor can be completed.

In the prior art technology described above, the indented parts of the multi-layer film are formed with wet etching utilizing the difference of etching speed of the multi-layer film. The precise control of the amount of etching for such a wet etch process is difficult. Because the more the storage node is stacked, the weaker the mechanical strength of the column formed of the first conduction layer in the contact hole 18 to connect the switching transistor with the capacitor storage node becomes, the problem of low reliability arises.

SUMMARY OF THE INVENTION

The object of this invention, being to solve foregoing problems, is to increase a capacitor capacity of a stacked semiconductor memory as well as to improve the reliability of the process.

This and other objects and the features of this invention can be achieved by providing a semiconductor memory comprising a semiconductor substrate; transistors having gate poles and, source and drain area formed on the semiconductor substrate; an insulation film formed on all over the surface of the transistor having contact hole with round upper part exposing the source and drain area of the transistor; and a capacitor storage node having a first conduction layer formed inside and along the round part of the contact hole on the insulation film and extended up to a certain desired height and a second conduction layer formed over the first conduction layer which is, in turn, formed over the insulation layer having curved internal portion and curved inside, and a method for fabricating a semiconductor memory comprising steps for forming transistors on a semiconductor substrate, forming an insulation film on all over the surface of the semiconductor substrate on which the transistors have been formed, forming contact holes having round upper part by etching the insulation film selectively, forming a first conduction layer, an etch preventing film and a temporary film on all over the surface of the resultant successively, carrying out etching of the temporary film and the etch preventing film selectively to expose the first conduction layer, forming side walls of the temporary film at the side of the temporary film by forming an insulation film on all over the surface of the resultant and etching back thereafter, patterning the first conduction film using the temporary film and the side walls of the temporary film as masks, etching the insulation film selectively, removing the temporary film and the side walls of the temporary film, forming second conduction film on all over the surface of the resultant, etching back the second conduction layer, and forming a capacitor storage node composed of the first conduction layer and the second conduction layer by removing insulation film.

DETAILED DESCRIPTION OF THE INVENTION

The details of the preferred embodiments of this invention are to be explained hereinafter referring to the accompanying drawings.

Figure 3:
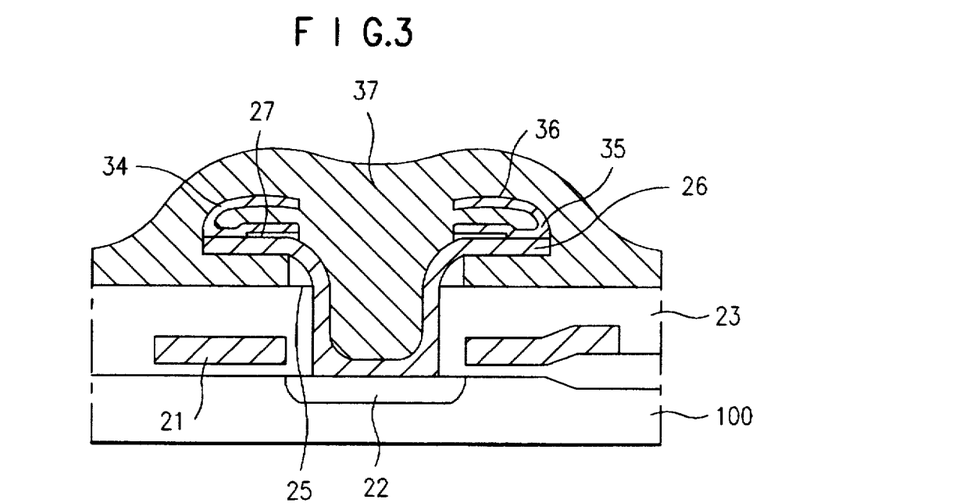
FIG. 3 is a sectional view of a capacitor formed by a forming method of a capacitor of a memory in accordance with the first embodiment of this invention.

FIG. 3 is a sectional view of a capacitor of a semiconductor memory formed in accordance with a first embodiment of this invention.

A capacitor of a semiconductor memory in accordance with this invention has, as shown in FIG. 3, a switching transistor having gate pole 21 and source and drain area 22, formed in an active region of a semiconductor substrate 100 divided into an active region and field region. On the entire surface of the switching transistor, an oxide film 23 as a first insulation film is formed. On this oxide film 23, a contact hole for connecting the switching transistor with a capacitor is formed in the source and drain area 22.

Through the contact hole, the capacitor storage node is connected with the source (or drain) area 22 of the switching transistor. The capacitor storage node has stacks of a first conduction layer 26 and a second conduction layer 34.

The first conduction layer 26 of the stacked storage node is formed along the inner surface of the contact hole, with a curved shape in the upper part of the contact hole, and extending above the first insulation film 23.

And the second conduction layer 34 of the stacked storage node is formed on the first conduction film 26 and it has an inside bend.

On the entire surface of the stacked storage node connected as described above, a capacitor dielectric film 36 is formed, and on the entire surface of the dielectric film, a capacitor plate pole 37 is formed.

As described above, a semiconductor memory capacitor in accordance with this invention can provide a storage node having a stack of upper and lower conduction film. The coating property of the lower conduction film formed along the upper curved part of the contact hole can be improved.

By utilizing the curved part, the capacitor storage node has an increased surface area, thus permitting the capacitor to have a large capacity.

Next, a method for production of capacitor of a semiconductor memory according to the first embodiment of this invention will be described hereinafter, referring to FIGS. 2(a) to 2(k).

Figure 2A:
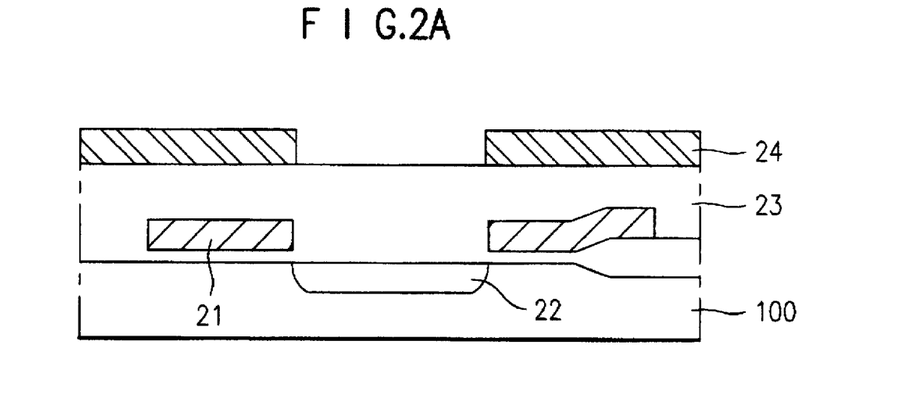
FIGS. 2(a) to 2(k) are processes showing a forming method of a capacitor of a semiconductor memory in accordance with a first embodiment of this invention.

First, as shown in FIG. 2(a), form a switching transistor composed of gate pole 21 and source and drain area 22 on a semiconductor substrate 100 having divided into active region and field region. Then, form for example, an oxide film 23 as the first insulation film on the entire surface of the resultant structure. On the oxide film 23, then form, for example, 1000 angstroms to 2000 angstroms thick nitride film 24 as the second insulation film which has greater selective etching ratio than the oxide film of the first insulation film using SiH4 gas or NH3 gas with LPCVD (Low Pressure Chemical Vapor Deposition) method or PECVD (Plasma Enhanced Chemical Vapor Deposition) method. Finally, etch the nitride film 24 into a desired pattern with a photo-etching process.

Figure 2B:
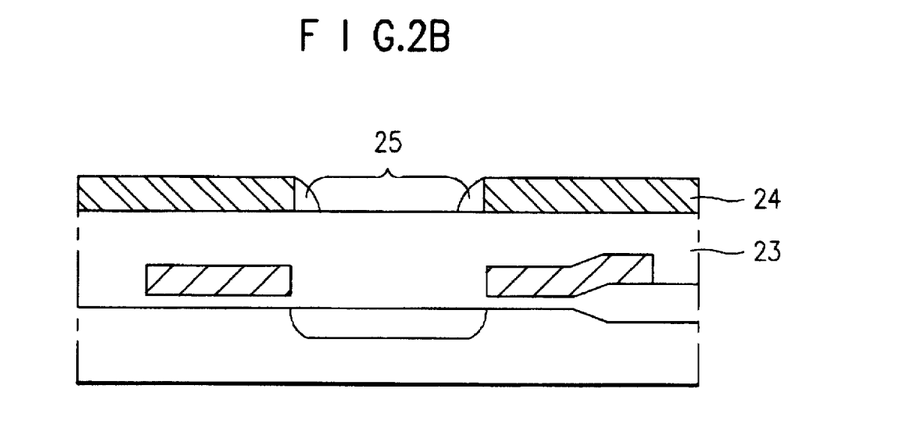

Then, as shown in FIG. 2(b), after forming, for example, a silicon or nitride film of 1000 to 2000 angstroms thick as the third insulation film (not shown) above the oxide film 23 on which the nitride film pattern 24 has been formed, etch back using gases containing Cl or F such as $Cl_2$ or $CF_4$ with anisotropic dry etching to form side walls 25 on the side of the nitride film pattern 24.

Figure 2C:
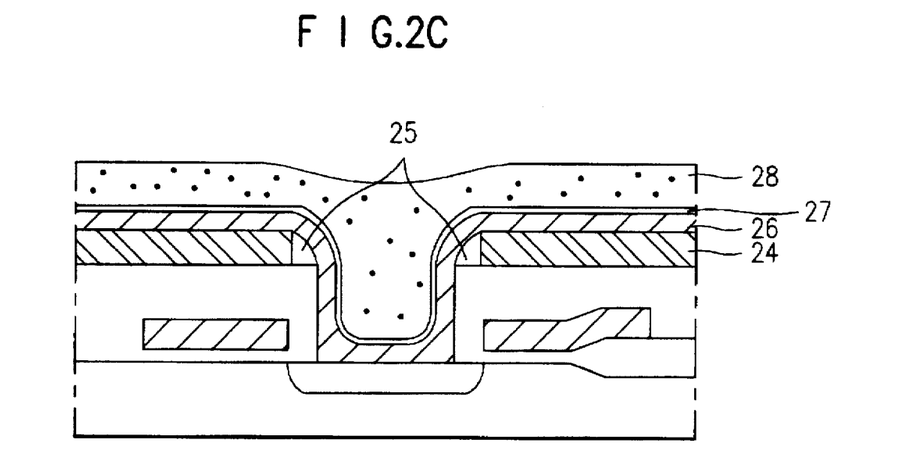

Next, as shown in FIG. 2(c), carry out a selective dry etching of the formed nitride film pattern 24 and the side wall 25 using a mask, and the oxide film 23 under the nitride film pattern 24 and the side wall using gases such as $CHF_3$ to form a contact hole so as to expose the source (or drain) area 22 of the formed switching transistor. Then form a first conduction layer 26, an etch preventing film 27 and a temporary film 28 successively on the entire surface of the above resultant.

The first conduction layer 26 is a silicon film such as an amorphous silicon film or a poly crystal silicon film formed with LPCVD method using a mixture gas of $SiH_4$ and $PH_3$ etc., at a temperature of 540 degrees C. to 620 degrees C. to a thickness of 500 angstroms to 1500 angstroms. The etch preventing film 27 is an organic insulation film such as polyimide or PIQ or nitride film, having a selective etching property over the silicon film of the first conduction layer 26 in dry etching formed to a thickness of 500 angstrom to 2000 angstroms. The temporary film 28 is of materials having a selective etching property over the etch preventing film 27 in wet etching, for example an oxide film which is formed to a thickness of 1000 angstroms to 2000 angstroms with LPCVD method or PECVD method using gases such as $SiH_4$ gas or $O_2$ gas.

Because the first conduction layer 26 is deposited along the side wall 25 of the nitride film pattern 24 formed above the contact hole, the coating property of the conduction layer 26 at the contact hole can be improved.

Figure 2D:
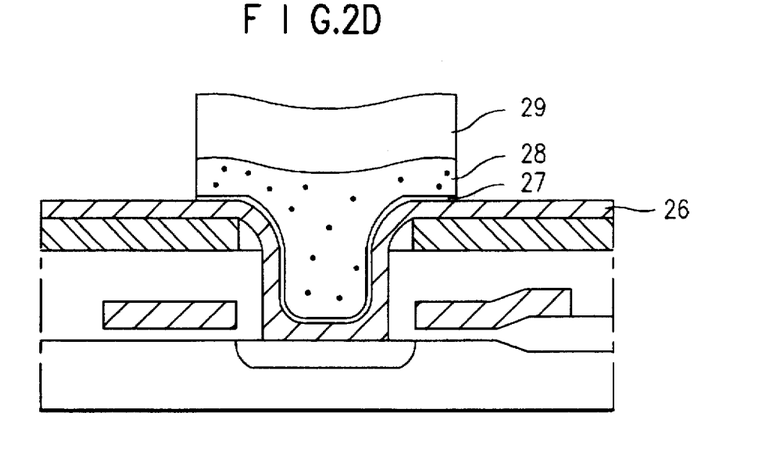

Next, as shown in FIG. 2(d), carry out a selective etching of the temporary film 28 and the etch preventing film 27 with plasma etching method or $O_2$ sputtering etching method, etc., using $CHF_3$, $CF_4$, or $O_2$ utilizing the photo resist pattern 29 having formed with a general photo etching process as a mask, to expose the first conduction layer 26.

Figure 2E:
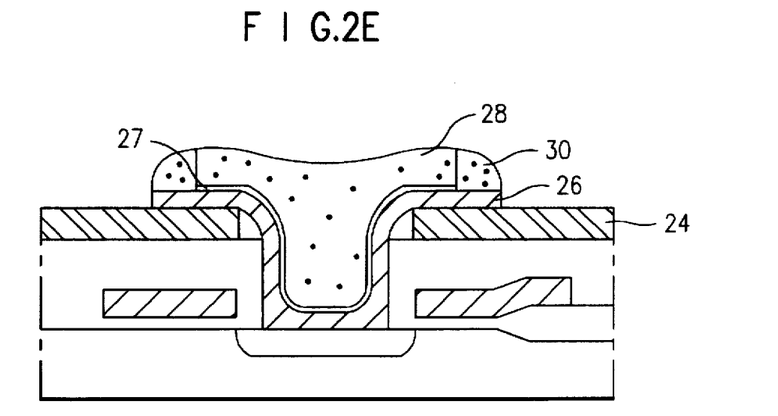

Next, as shown in FIG. 2(e), after removing the photo resist pattern, deposit an oxide film of the same material as the temporary film 28 to a thickness of 1000 angstrom to 2500 angstroms on all over the surface of above resultant, then form a side wall 30 on the side of the temporary film 28 by etching back with anisotropic dry etching. Thereafter carry out patterning of the expose first conduction layer 26 using the temporary film 28 and the side wall 30 of the temporary film as a mask with a selective etching using gases like $Cl_2$.

At this time, as the width of the first conduction layer is increased as much as the width of the side wall of the temporary film 30, the capacity of the capacitor can be increased.

Figure 2F:
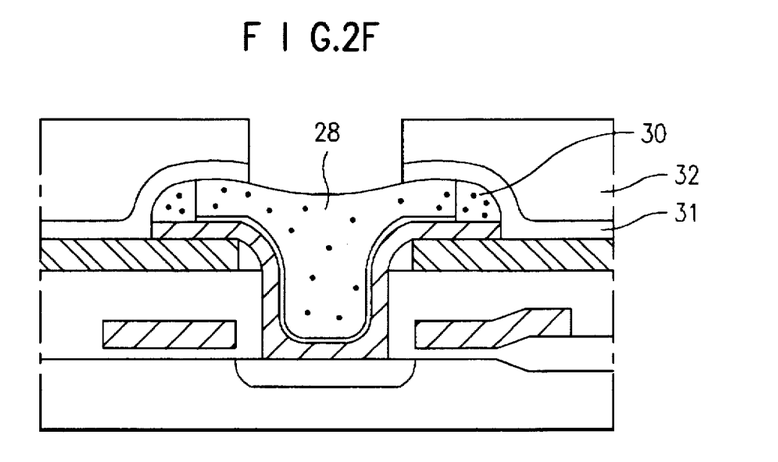

Then, as shown in FIG. 2(f), form a fourth insulation film 31, which is an organic insulation film of polyimide and the like or a nitride film. The fourth insulation film 31 has a selective etching property over the temporary film 28 and the side wall 30 in wet etching, and over the first conduction film 26 in dry etching. The fourth insulation film 31 is formed to a thickness of 1000 angstroms to 2000 angstroms on all over the surface of the above resultant.

After forming a predetermined photo resist pattern 32 on the fourth insulation film 31 with a general photo etching process, using the photo resist 32 as a mask, carry out selective etching of the fourth insulating film 31 to expose the surface of the temporary film 28 selectively.

Figure 2G:
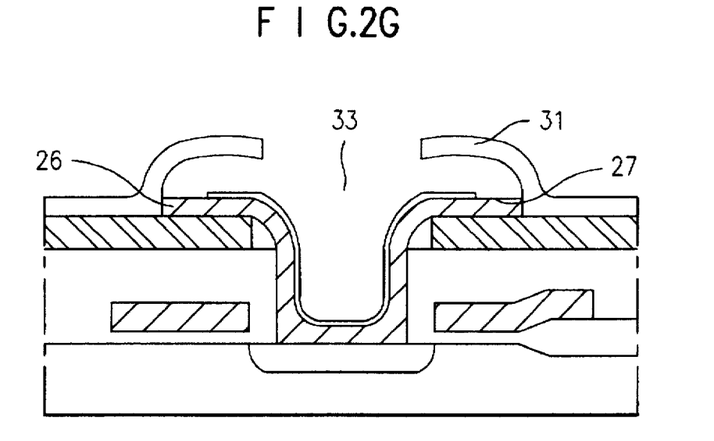

Next, as shown in FIG. 2(g), after removing the photo resist pattern 32 used as a mask, remove the temporary film 28 and the side wall 30 of the temporary film with wet etching using water solution containing HF liquid to form an internal space 33.

Figure 2H:
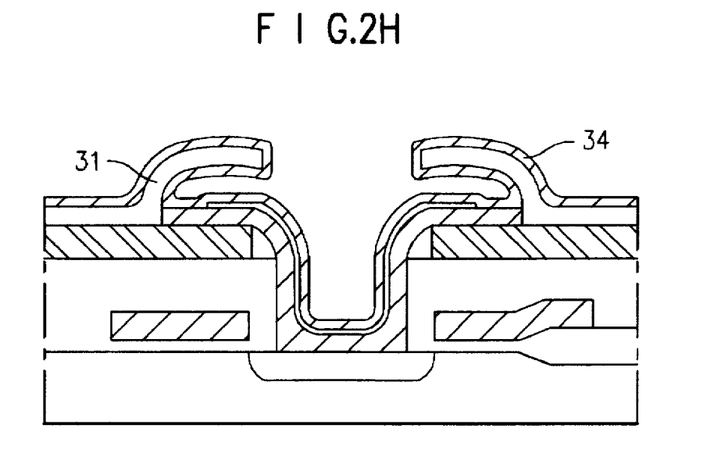

Thereafter, as shown in FIG. 2(h), form a second conduction layer 34 by deposition of a conductive silicon film with LPCVD method at 540 degrees C. to 620 degrees C. to a thickness of 500 angstrom to 1000 angstroms on all over the surface of above resultant. Since the second conduction layer 34 is formed along the slope of the internal space 33, the coating property can be improved and the area of the capacitor pole can be increased.

Figure 2I:
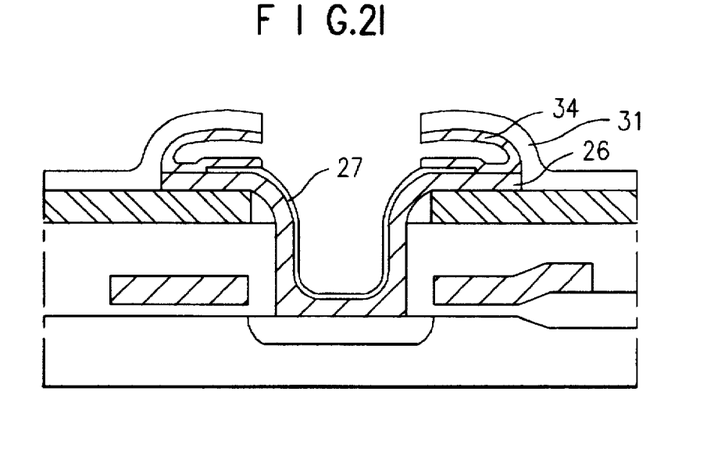

Next, as shown in FIG. 2(I), etch back the second conduction layer 34 so as to leave the second conduction layer only on inside surface of the internal space selectively.

At this time, the etch preventing film 27 serves to prevent the first conduction layer 26 from being etched in the etching process of the second conduction layer 34.

Figure 2J:
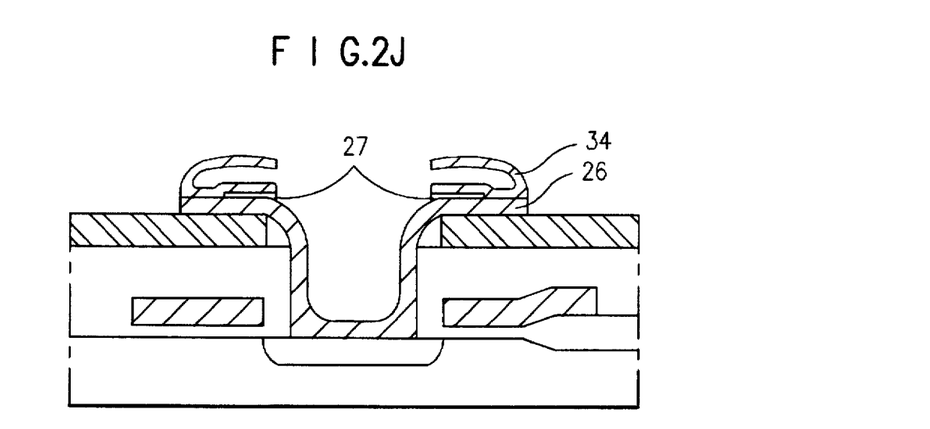

Next, as shown in FIG. 2(j), after selective etching of the etch preventing film 27 using the second conduction layer 34 as a mask to expose the first conduction film 26, remove the fourth insulation film 31 with wet etching.

Figure 2K:
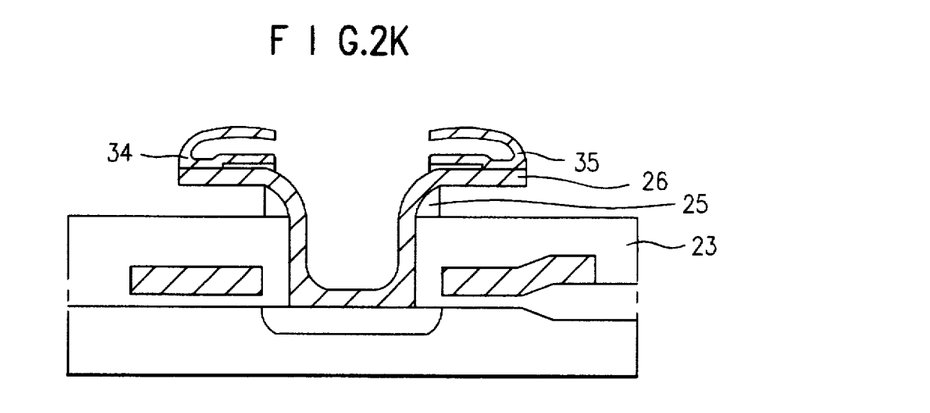

Next, as shown in FIG. 2(k), complete a stacked capacitor storage node 35 composed of the first conduction layer 26 and the second conduction layer 34 by removing the first insulation film under the first conduction layer 26 with wet etching.

A capacitor of a semiconductor memory, as shown in FIG. 3, can be obtained by forming a capacitor plate pole 37 by deposition of conductive silicon film with LPCVD method at 540 degrees C. to 620 degrees C. to a thickness of 2000 angstroms after forming, for example, a stacked film of a silicon nitride film and an oxide film as a capacitor dielectric film 36 on the surface of the storage node formed in the foregoing method.

Figure 4:
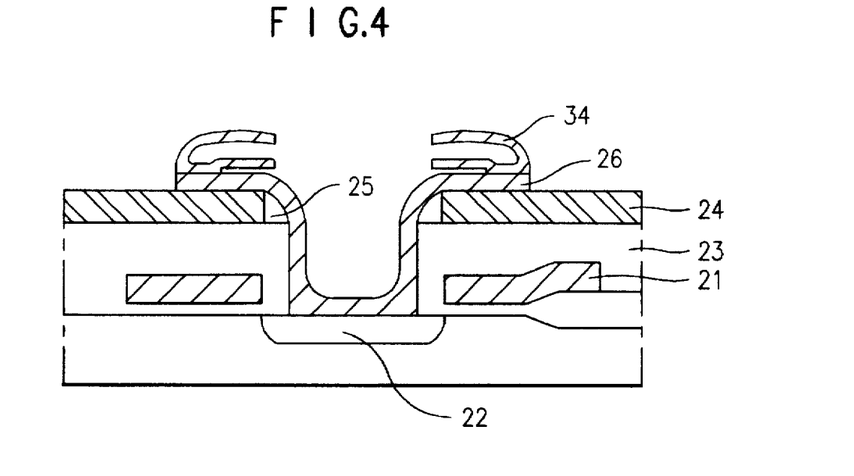
FIG. 4 shows a forming method of a capacitor of a memory in accordance with a second embodiment of this invention.

FIG. 4 shows a second embodiment of this invention, wherein the processes up to FIG. 2(I) can be finished by utilizing the same processes as those of the forgoing first embodiment as shown in FIGS. 2(a)–2(I). Thereafter, remove the etch preventing film 27 completely without leaving any residue with wet etching to increase the surface area of the storage node by utilizing the space produced by the removal of the etch preventing film 27. The processes thereafter proceed the same as those shown in FIG. 2(k) and FIG. 3.

Next, FIG. 5 shows a third embodiment of this invention.

Figure 5A:
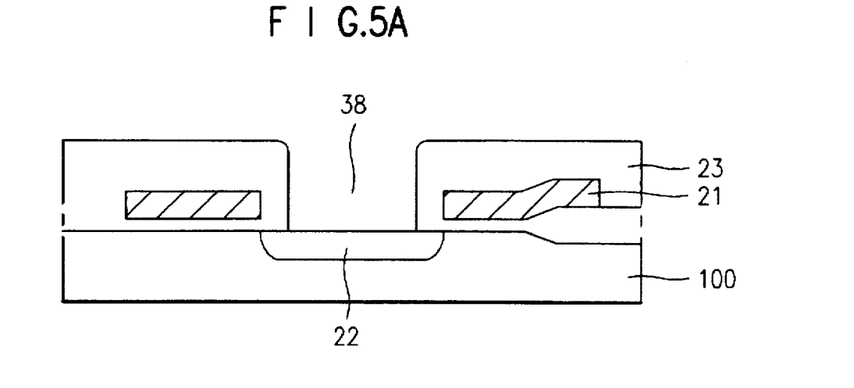
FIGS. 5(a) to 5(e) are processes showing a forming method of a capacitor of a memory in accordance with a third embodiment of this invention.

First, as shown in FIG. 5(a), form a switching transistor composed of gate pole 21 and source and drain area 22 in the active region of a semiconductor substrate 100 divided into an active region and field region. Then, after forming, for example, an oxide film as a first insulation film 23 on the entire surface of the above resultant, etch the oxide film selectively to form a contact hole 38 to expose the source (or drain) area 22 of the switching transistor.

Figure 5B:
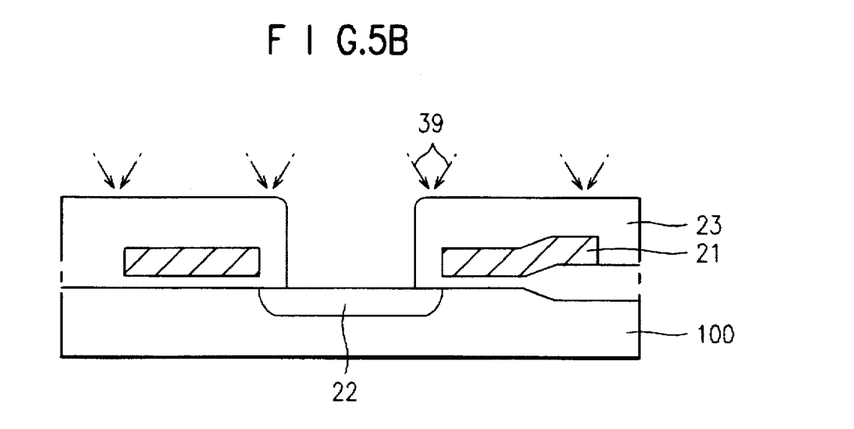

Next, as shown in FIG. 5(b), form curves on the upper part of the contact hole 38 by sputter etching 39 of the oxide film 23 around the upper part of the contact hole using inert gases like Ar+. This allows one to omit the forming processes of the nitride film pattern 24 and the side wall 25 above the first insulation film 23 in the first embodiment as shown in FIG. 2(b). The curves formed on the upper part of the contact hole enable the improvement in the coating property of the first conduction layer.

Instead of the foregoing Ar+ sputter etching, isotropic etching with a wet etching using a solution containing HF or an isotropic etching containing F ions can also be used to form the curves on the upper part of the contact hole.

Figure 5C:
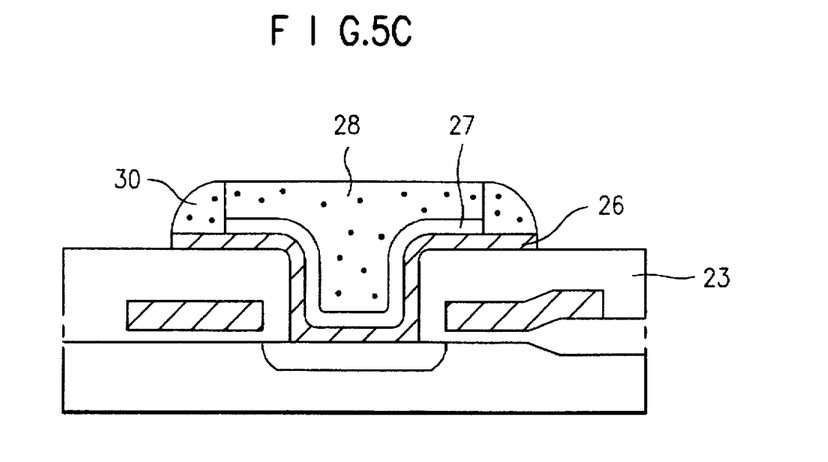

Next, as shown in FIG. 5(c), after forming a first conduction layer 26, an etch preventing film 27 and a temporary film 28 successively on all over the surface of above resultant, carry out a selective etching of the temporary film 28 and the etch preventing film 27 using a photo resist pattern (not shown) formed by a general photo etching process as a mask, to expose the first conduction layer 26. Then form side walls 30 on the side of the temporary film 28. By utilizing the temporary film 28 and the side walls 30 of the temporary film as a mask, carry out patterning by an selective etching of the exposed first conduction layer 26. The first conduction layer 26, the etch preventing film 27 and the temporary film 28 are formed of the same materials as those of the first embodiment. They are deposited and then etched to a desired pattern by the same processes as those of the first embodiment.

Figure 5D:
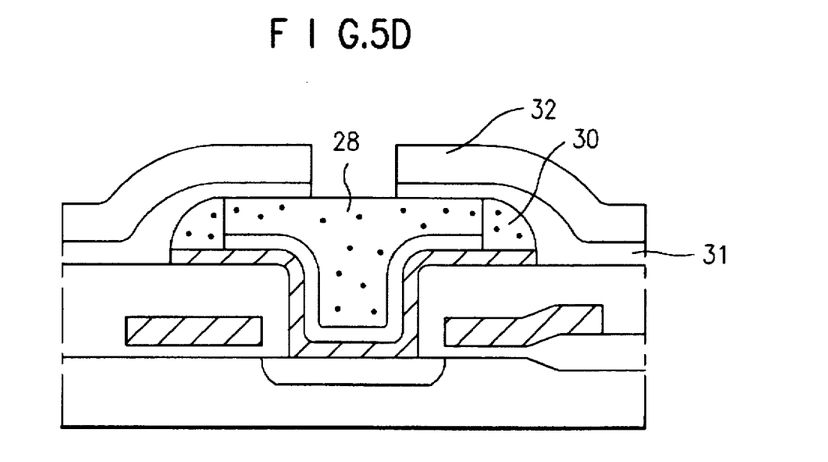

Next, as shown in FIG. 5(d), after forming an insulation film 31 on the entire surface of the above resultant, carry out a selective etching of the insulation film 31 using a predetermined photo resist pattern 32, to expose the surface of the temporary film 28 selectively.

Figure 5E:
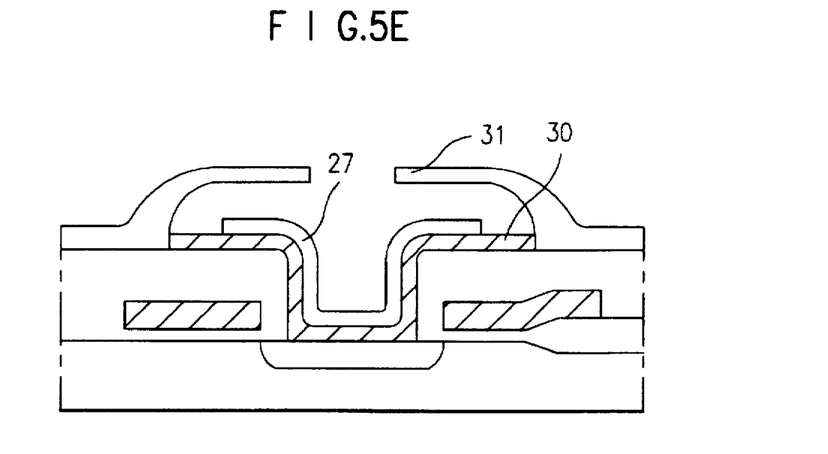

Next, as shown in FIG. 5(e), remove the photo resist pattern 32 used as a mask, and remove the temporary film 28 and the side wall 30 of the temporary film with wet etching using a water solution containing HF solution to form an internal space.

The processes thereafter proceed the same as the processes of the first embodiment of this invention.

The first conduction layer 26, the etch preventing film 27, the temporary film 28 and the insulation film 32 are formed of the same materials via the same deposition methods, and etched to a desired pattern with the same etching method, as those of the first embodiment. Therefore, the descriptions for those processes will be omitted.

In a stacked capacitor according to this invention, because the first conduction layer which is the lower conduction layer is formed along the curve of the upper part of the contact hole connecting the switching transistor with the capacitor, the coating property can be improved. Because the second conduction layer which is the upper conduction layer is formed along the sloped surface of the internal space formed following the forming and the removal of the temporary film and the side wall of the temporary film, it is possible to achieve the coating property improvement as well as the increase of the area of the capacitor pole. This is due to the increase of the width of the second conduction layer to an amount equal to the width of the side wall of the temporary film. Further increase of the capacitor pole area by the space produced through the removal of the entire etch preventing film is also possible. As a result, increase of a capacitor capacity of a semiconductor memory becomes possible.

In the meantime, relief from the strictness of processes can be obtained because the patterning on the insulation film is carried out in a self-adjusting way without utilizing the upper and the lower conduction film as a photo resist mask.

Although the invention has been described in conjunction with specific embodiments, it is evident that many alternatives and variations will be apparent to those skilled in the art in light of the foregoing description. Accordingly, the invention is intended to embrace all of the alternative and variations that fall within the spirit and scope of the appended claims.

What is claimed is:

1. A semiconductor memory comprising:

a semiconductor substrate;

a transistor having a gate pole, a source area, and a drain area formed on the semiconductor substrate;

an insulation layer formed on a surface of the transistor, the insulation layer having a contact hole with a round upper part, the contact hole exposing the source area of the transistor; and a capacitor storage node having a first conduction layer and a second conduction layer, wherein the first conduction layer is formed inside the contact hole and along the round upper part of the contact hole on the insulation layer and extended up to a preset height, the second conduction layer is formed over the first conduction layer, the second conduction layer having a first part laying substantially horizontal to and on the first conduction layer and a curved second part connected to the first part, the second part extending substantially parallel to and above the first part, thus forming a curved internal space between the first part and the second part.

2. The semiconductor memory as claimed in claim 1, wherein the insulation layer having the contact hole includes an insulation film formed over the transistor and an insulation side wall formed over the insulation film and adjacent to the contact hole.

3. The semiconductor memory as claimed in claim 2, wherein the insulation side wall forms the upper round part of the contact hole.

4. The semiconductor memory as claimed in claim 1, further comprising a capacitor dielectric film formed on an entire surface of the capacitor storage node and a capacitor plate pole formed on an entire surface of the capacitor dielectric film.

5. The semiconductor memory as claimed in claim 1, further comprising an etch preventing film formed in a junction part between the first conduction layer and the first part of the second conduction layer, the etch preventing film filling a gap between the first conduction layer and the first part of the second conduction layer.

6. The semiconductor memory as claimed in claim 5, wherein the first part of the second conduction layer has an upper portion located above the etch preventing film and a lower portion located directly above the first conduction layer.

7. The semiconductor memory as claimed in claim 1, wherein the first part of the second conduction layer has an upper portion and a lower portion, the upper portion being apart from the first conduction layer, thereby forming an internal area between the upper portion and the first conduction layer, the lower portion being located directly above the first conduction layer.

8. A semiconductor memory comprising:

a transistor having a source area and a drain area formed on a semiconductor substrate;

an insulation layer formed on the transistor having a contact hole with a round upper part, the contact hole exposing the source area of the transistor; and a capacitor storage node having a first conduction layer and a second conduction layer, wherein the first conduction layer is formed inside the contact hole and along the round upper part of the contact hole and extended up to a preset height, the second conduction layer is formed over the first conduction layer, the second conduction layer having a first part laying substantially horizontal to and on the first conduction layer and a second part connected to an end of the first part, the second part extending substantially parallel to and above the first part to form an internal space between the first part and the second part.

* * * * *